(12) United States Patent
Cheng

(10) Patent No.: US 7,768,026 B2
(45) Date of Patent: Aug. 3, 2010

(54) LIGHT-EMITTING DIODE PACKAGE AND METHOD FOR FABRICATING THE SAME

(75) Inventor: Yuan-Sheng Cheng, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 169 days.

(21) Appl. No.: 12/133,472

(22) Filed: Jun. 5, 2008

(65) Prior Publication Data

US 2009/0159911 A1    Jun. 25, 2009

(30) Foreign Application Priority Data

Dec. 21, 2007    (CN) .................. 2007 1 0203334

(51) Int. Cl.
*H01L 33/00* (2010.01)
(52) U.S. Cl. .................. 257/98; 257/99; 257/100; 438/25; 438/28
(58) Field of Classification Search ............ 257/98, 257/99, 100; 438/25, 26, 28
See application file for complete search history.

(56) References Cited

U.S. PATENT DOCUMENTS

| | | | | |
|---|---|---|---|---|
| 3,710,167 | A * | 1/1973 | Dresner et al. | 313/504 |
| 6,930,332 | B2 * | 8/2005 | Hashimoto et al. | 257/98 |
| 2005/0168967 | A1 * | 8/2005 | Kao et al. | 362/27 |
| 2006/0067073 | A1 * | 3/2006 | Ting | 362/231 |

* cited by examiner

*Primary Examiner*—Phuc T Dang
(74) *Attorney, Agent, or Firm*—Steven M. Reiss

(57) ABSTRACT

An LED package (200) includes a housing (24), an LED array (22), a phosphor layer (262) and a transparent packaging layer (264). The LED array is received in the housing, the phosphor layer is uniformly and homogenously formed on the LED array; and the transparent packaging layer packages the LED array and the phosphor layer in the housing. A method for fabricating the LED package is also provided.

10 Claims, 4 Drawing Sheets

LIGHT-EMITTING DIODE PACKAGE AND METHOD FOR FABRICATING THE SAME

BACKGROUND OF THE INVENTION

1. Field of the Invention

The present invention relates to light-emitting diode (LED) packages and method for fabricating the same, particularly to an LED package having a high light-emitting quality and a method for fabricating the same.

2. Description of Related Art

Light-emitting diodes (LEDs) are widely used in many electronic devices, such as computers, mobile phones, and personal digital assistants (PDAs). In use, LEDs are usually arranged in arrays and assembled with other components to form LED packages to improving their light-emitting quality.

Referring to FIG. 4, a typical LED package 100 includes an LED array 12, a housing 14 and a packaging member 16. The housing 14 is bowl shaped in profile, the LED array 12 is mounted on a central portion of an inner surface (not labeled) of the housing 14. The inner surface is configured to have a predetermined reflectivity, so that light propagating/radiating out of the LED array 12 is reflected and then enhances the light-emitting intensity of the LED package 100. The packaging member 16 includes a packaging layer 161 that is made of transparent materials, such as resin, and many phosphor grains 162 mixed in the packaging layer 161 uniformly and homogeneously. The packaging layer 161 is disposed in the housing 14 to package the LED array 12 and form a flat light exiting surface 1611 adjacent to the opening (not labeled) of the housing 14. In this way, when the LED array 12 is powered and emits primary light, the primary light invokes/activates the phosphor grains 162 to emit secondary light. The secondary light is mixed with the primary light to form final light having a predetermined color and traveling out of the light exiting surface 1611. For example, if the LED array 12 emits primary light blue in color and the phosphor grains 162 emit secondary light yellow in color, the final light would be white light.

However, in the typical LED package 100, because the housing 14 is configured in a bowl shape, distance between the LED array 12 and different points of the light exiting surfaces varies. Therefore, primary light propagating/radiating out of different portions of the light exiting surface 1611 may respectively propagates/radiates in various distances in the packaging layer 161 and activate different numbers of the phosphor grains 162, thus are respectively mixed with different amounts of secondary light and have different colors. In this way, light emitting quality of the LED package 100 is decreased.

For example, as shown in FIG. 4, a distance between the point B of the light exiting surface 1611 and the LED array 12 is less than a distance between the point A or C of the light exiting surface 1611 and the LED array 12. Primary blue light propagating/radiating from the LED array 12 to the point B has a short propagating/radiating distance in the packaging layer 161 and activates less phosphor grains to emit secondary yellow light. Thus, the final light propagating/radiating from the point B is mixed with less secondary yellow light and tends to be blue in color. On the other hand, primary blue light propagating/radiating from the LED array 12 to the point A or the point C has a long propagating/radiating distance in the packaging layer 161 and activates more phosphor grains to emit secondary yellow light, thus the final light propagating/radiating from the point A or the point C has more secondary yellow light mixed therein and tends to be yellow in color.

Therefore, final light propagating/radiating out of different portions of the light exiting surface 1611 may propagate/radiate in various distances in the packaging layer 161 and activate different numbers the phosphor grains 162, thus are respectively mixed with different amounts of yellow light and have different colors. Additionally, if the phosphor grains 162 are not enough uniformly and homogenously mixed in the packaging layer 161 in fabrication, the difference in color of final light emitted from different portions of the light exiting surface 1611 may be further increased.

Therefore, a new LED package and a new method for fabricating the same are desired in order to overcome the above-described shortcomings.

BRIEF DESCRIPTION OF THE DRAWINGS

Many aspects of the present LED package and method for fabricating the same can be better understood with reference to the following drawings. The components in the various drawings are not necessarily drawn to scale, the emphasis instead being placed upon clearly illustrating the principles of the present LED package and method for fabricating the same. Moreover, in the drawings, like reference numerals designate corresponding parts throughout the diagrams.

DETAILED DESCRIPTION OF THE INVENTION

Figure 1:
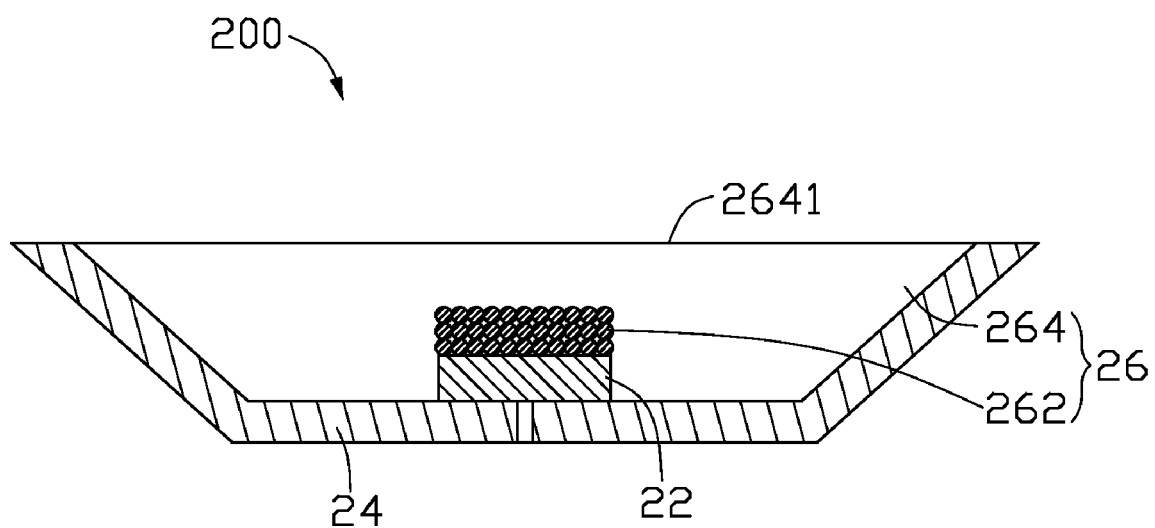
FIG. 1 is a cross-section view of an exemplary LED package according to the invention.

Referring to FIG. 1, a light-emitting diode (LED) package 200 in accordance with a exemplary embodiment of the invention is shown. The LED package 200 includes an LED array 22, a housing 24 and a packaging member 26. The housing 24 is bowl shaped in profile. The LED array 22 is received in the housing 24 and mounted on a central portion of an inner surface (not labeled) of the housing 24. The inner surface is configured to have a predetermined reflectivity, so that primary light propagating/radiating out of the LED array 22 can be reflected to enhance the light-emitting intensity of the LED package 200. The packaging member 26 includes a phosphor layer 262 formed on a top surface of the LED array 22 and a packaging layer 264. The phosphor layer 262 is compactly fixed to the LED array 22, and includes phosphor grains (not labeled) uniformly and homogenously accumulated on a top surface of the LED array 22. The packaging layer 264 is made of transparent materials, such as resin, glass, or silicone. The packaging layer 264 in the housing 24 packages the LED array 22 and the phosphor layer 262 in the housing 24 and forms a flat light exiting surface 2641 adjacent to an opening (not labeled) of the housing 24.

In use, the LED array 22 is powered and emits primary blue light. When the primary blue light travels through the phosphor layer 262, the phosphor layer 262 is activated to emit secondary yellow light. The secondary yellow light mixes with the blue light to form final white light traveling out of the light exiting surface 2641.

In the exemplary embodiment, because the phosphor grains of the phosphor layer 262 are uniformly and homogenously accumulated on the LED array 22 and fixed compactly on the LED array 22, the primary blue light propagating/radiating out of the LED array 22 travels substantially uniformly through the phosphor layer 262, thus, invoking/activating a substantially uniform amount of the phosphor grains in travel paths of the primary blue light radiantly. As a result, an approximately equal amount of the secondary yellow light mixes with the primary blue light to each portion of the light exiting surface 2641. Thus, the final light out of different portions of the light exiting surface 2641 has a uniform color, and, in addition, the transparent packaging layer 264 should not affect the color quality of the final light.

In other exemplary embodiments, the phosphor layer 262 can be enlarged to cover both the top surface and a side surface of the LED array 22. Thus, a greater amount of the primary blue light from the LED array 22 can travel in approximately equal distances in the phosphor layer 262 before exiting the light exiting surface 2641. In use, a size of the phosphor layer 262 can also be decreased, a shape of the phosphor layer 262 can be changed, and more than one phosphor layers 262 can be respectively formed on the LED array 22. Besides the primary blue light and the secondary yellow light, the light emitted by the LED arrays and the activated phosphor layer 262 can also be in other colors. Thus, the LED package 200 can be configured to satisfy many different specifications and/or requirements.

Figure 2:
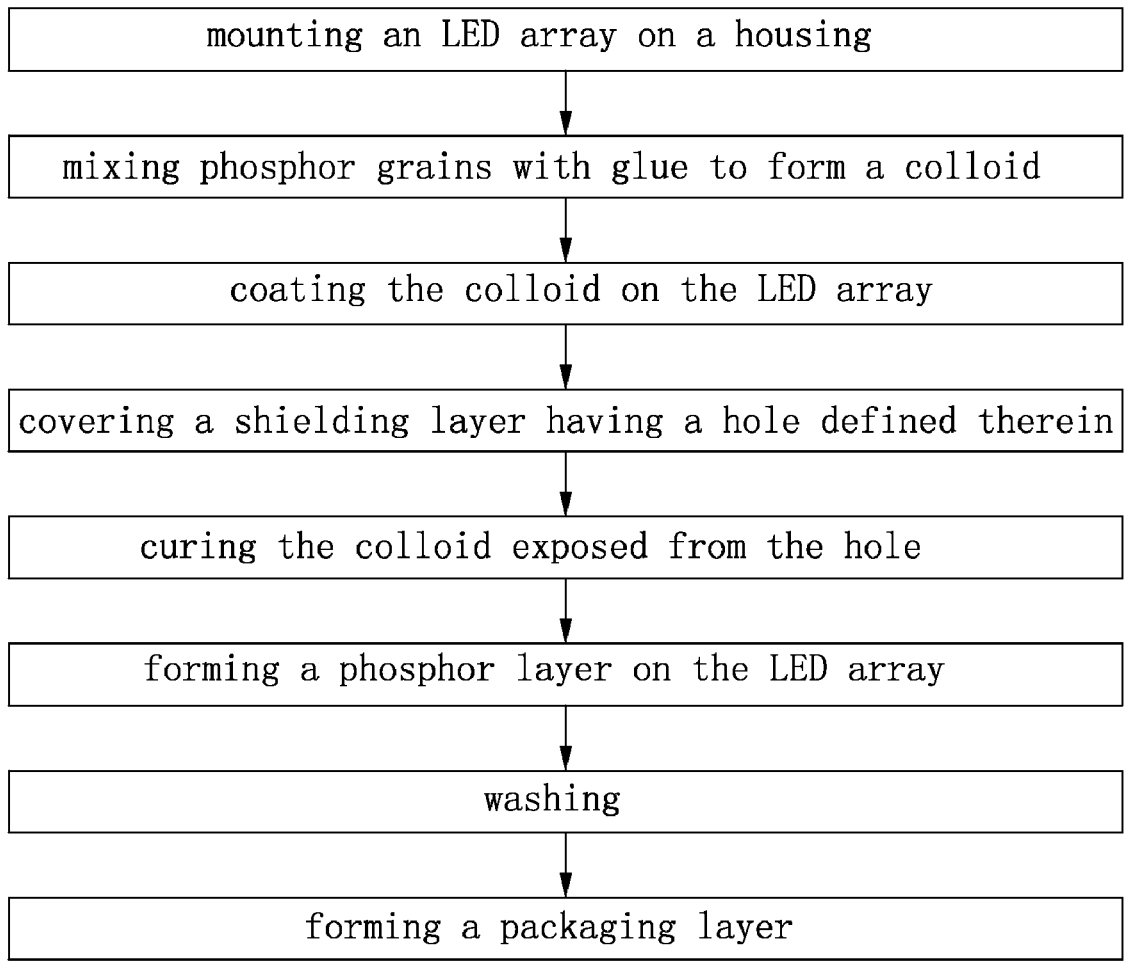
FIG. 2 is a flow chart of a method in accordance with an exemplary embodiment for fabricating an LED package, such as shown in FIG. 1.
Figure 3:
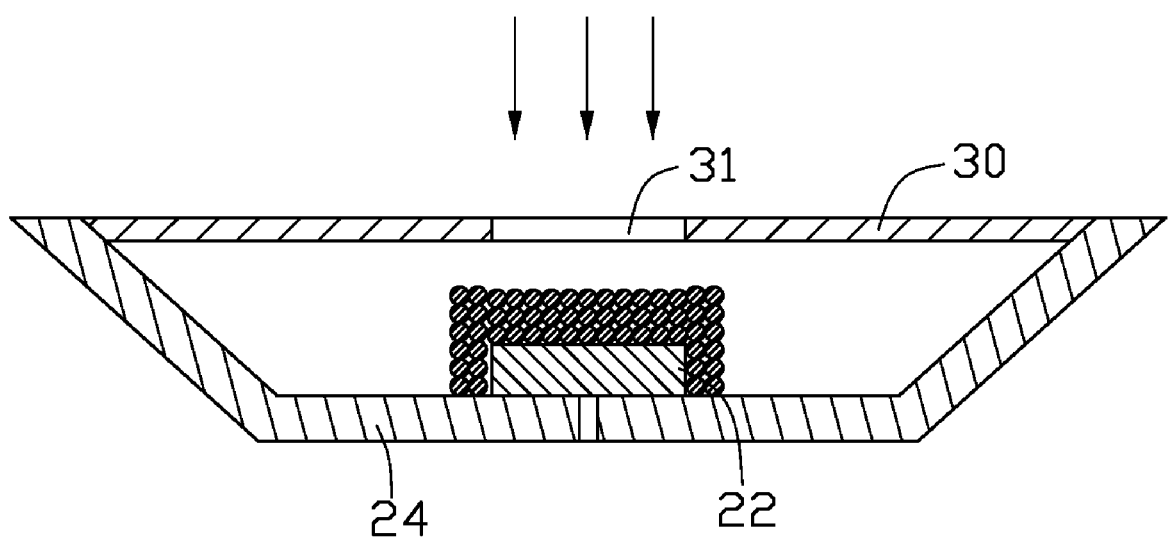
FIG. 3 is a schematic view of forming a phosphor layer of the LED package shown FIG. 1 by the method shown in FIG. 2.
Figure 4:
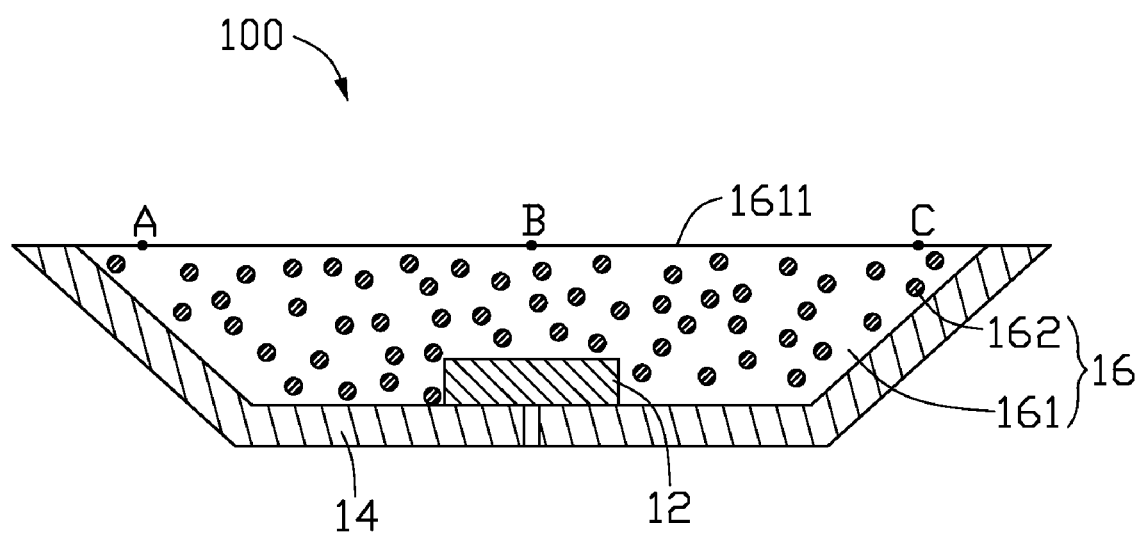
FIG. 4 is a cross-section view of a typical LED package.

Also referring to FIG. 2 and FIG. 3, a method in accordance with a present embodiment that is configured for fabricating the LED package 200 is shown. The method includes the following steps.

First, an LED array 22 and a housing 24 are provided, and the LED array 22 is mounted on a central portion of an inner surface of the housing 24.

Second, some phosphor grains and adhesive substance, such as UV (ultraviolet) curable silicon, are provided. The phosphor grains are mixed with the adhesive substance to form a colloid containing phosphor grains accumulating therein, and the colloid is uniformly and homogeneously coated on the LED array 22 by means of spin coating or screen coating, etc.

Third, a shielding film 30 configured for shielding ultraviolet is provided. The shielding film 30 defines at least one hole 31 having a size and a shape corresponding to that of a phosphor layer 262 predetermined to be formed on the LED array 22 therein. The housing 24 and the LED array 22 are covered by the shielding film 30.

Fourth, the exposed colloid is cured by ultraviolet radiation. The adhesive substance is solidified to form the phosphor layer 262 having a uniform and homogenous thickness and including many phosphor grains.

Fifth, the shielding film 30 is removed, and the LED array 22 is washed. Excess (undesired) colloid, which flows to a side surface of the LED array 22 or the inner surface of the housing 24, is covered by the shielding layer 31, therefore the excess colloid would not get radiated and solidified. As a result, the excess colloid is removed after washing, and only solidified phosphor layer 262 remains on the LED array 22. At the same time, the inner surface of the housing 24 is cleaned. Understandably, when size, shape or number of the holes 31 are changed, the corresponding characters of the phosphor layer 262 can also be changed.

Finally, transparent materials, such as resin, glass or silicone are melted and filled into the housing 24, then is cooled down to form the packaging layer 264 and the light exiting surface 2641. The light exiting surface 2641 can be ground or shaped in a mold to get a better flatness.

Understandably, as above detailed, in the present LED package 200, primary light propagating out of the LED array 22 and radiating in different directions are respectively mixed with approximately equal amount of secondary light. Directions and emitting distances in the packaging layer 264 have no effect on color of the final light exiting the light exiting surface 2641. Compared with typical LED packages, the present LED package 200 has more uniform and homogenous emitting light. The present method for fabricating the LED package 200 need not uniformly and homogenously mix the phosphor grains in the packaging layer 264, thus the operation of the present method is simplified and the quality of the LED package 200 is improved.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An LED package, comprising:
   a housing;
   an LED array received in the housing;
   a uniform and homogenous phosphor layer formed on the LED array, the phosphor layer including a mixture of phosphor grains and an adhesive substance, the adhesive substance gluing the phosphor grains on the LED array; and
   a transparent packaging layer packaging the LED array and the phosphor layer in the housing.

2. The LED package as claimed in claim 1, wherein the housing is bowl shaped, and the LED array is mounted in a central portion of an inner surface of the housing.

3. The LED package as claimed in claim 1, wherein the inner surface of the housing is configured for reflecting light emitted by the LED array.

4. The LED package as claimed in claim 1, wherein the phosphor layer includes phosphor grains homogenously accumulated on the LED array.

5. The LED package as claimed in claim 1, wherein the phosphor grains are accumulated on the LED array.

6. The LED package as claimed in claim 1, wherein the adhesive substance is ultraviolet (UV) curable silicone.

7. A method for fabricating an LED package, comprising:
   mounting an LED array on a housing;
   forming a colloid by mixing phosphor grains and an adhesive substance;
   coating the LED array with the colloid;
   solidifying the adhesive substance in the colloid to accumulate the phosphor grains on the LED array, thereby forming a phosphor layer on the LED array; and
   forming a transparent packaging layer in the housing to package the LED array and the phosphor layer in the housing.

8. The method as claimed in claim 7, further comprising a step of removing unwanted colloid after the step of forming a phosphor layer on the LED array.

9. The method as claimed in claim 7, further includes:
   covering a shielding film defining at least one hole therein on the housing and the LED array, and exposing the colloid coated on the portion of the LED array that is predetermined to form the phosphor layer thereon from the hole; and curing the exposed colloid by irradiation to solidify the adhesive substance in the colloid.

10. The method as claimed in claim 9, further comprising a step of removing unwanted colloid after the step of forming a phosphor layer on the LED array.

* * * * *